United States Patent
Bang et al.

(10) Patent No.: US 7,301,406 B2
(45) Date of Patent: Nov. 27, 2007

(54) METHOD AND SYSTEM FOR CALIBRATING INPUT VOLTAGE OF VOLTAGE CONTROLLED OSCILLATOR AND DIGITAL INTERFACE USED FOR CALIBRATING INPUT VOLTAGE

(75) Inventors: Hee-mun Bang, Seoul (KR); Dae-ki Kim, Seongnam-si (KR); Chong-ouk Kim, Goyang-si (KR); Heung-bae Lee, Suwon-si (KR); Sung-jae Jung, Seoul (KR); Sang-yoon Jeon, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 80 days.

(21) Appl. No.: 11/368,627

(22) Filed: Mar. 7, 2006

(65) Prior Publication Data

US 2006/0208808 A1    Sep. 21, 2006

(30) Foreign Application Priority Data

Mar. 7, 2005    (KR)    .................... 10-2005-0018584

(51) Int. Cl.
*H03L 7/095* (2006.01)
*H03L 7/10* (2006.01)
*H03L 7/18* (2006.01)
*G01R 23/00* (2006.01)

(52) U.S. Cl. .................... 331/16; 331/17; 331/44; 331/DIG. 2

(58) Field of Classification Search ............ 331/1 A, 331/14, 16–18, 25, 44, 179, DIG. 2; 327/156–159; 332/127; 360/51; 375/376; 455/260

See application file for complete search history.

(56) References Cited

U.S. PATENT DOCUMENTS 4,410,860 A * 10/1983 Kipp et al. ............ 331/1 A
6,308,055 B1    10/2001 Welland et al.

FOREIGN PATENT DOCUMENTS

KR    1998-026040 A    7/1998

* cited by examiner

*Primary Examiner*—David Mis
(74) *Attorney, Agent, or Firm*—Sughrue Mion, PLLC (57) ABSTRACT

A method and a system for calibrating an input voltage of a voltage controlled oscillator and a digital interface used for calibrating the input voltage. The method includes: setting a lock detection time for tuning a signal phase; setting a lock detection voltage section; setting output frequency values at predetermine spacings; checking connection states of capacitors of the capacitor bank necessary for a lock of the output frequency values; storing information regarding the connection states of the capacitors in the output frequency values; and if one of the output frequency values is determined depending on a change of a channel, setting connection states of the capacitors according to the information regarding the connection state corresponding to the one frequency value. The capacitor bank includes: a predetermined number of capacitors having different capacitances and connected to one another in parallel; and switches connected to the capacitors in series.

30 Claims, 4 Drawing Sheets

FIG. 5

# METHOD AND SYSTEM FOR CALIBRATING INPUT VOLTAGE OF VOLTAGE CONTROLLED OSCILLATOR AND DIGITAL INTERFACE USED FOR CALIBRATING INPUT VOLTAGE

CROSS-REFERENCE TO RELATED APPLICATIONS

This application claims priority from Korean Patent Application No. 10-2005-0018584, filed on Mar. 7, 2005, in the Korean Intellectual Property Office, the disclosure of which is incorporated herein by reference.

BACKGROUND OF THE INVENTION

1. Field of the Invention

The present invention relates to a method and a system for calibrating an input voltage of a voltage controlled oscillator (VCO) and a digital interface used for calibrating an input voltage.

2. Description of the Related Art

Frequency synthesizers are used to generate stable carrier frequency signals in many wireless telephone applications. As a user moves from a cell to a cell, a next cell operates at another frequency and thus requires a highly fast variation in a transmission frequency. Accordingly, the transmission frequency is required to vary. A new transmission frequency may be greatly different, and the transmission frequency must be re-established as a new channel frequency for microseconds so that the user is not affected by the movement from the cell to the cell.

A phase locked loop (PLL) must speedily re-set a phase lock for the new channel frequency to speedily change a frequency. Since a synthesizer does not have a VCO operating throughout a bandwidth of a cellular phone, it is difficult to design the synthesizer. Thus, the VCO must operate in a multiple frequency band or a multiple VCO covering the multiple frequency band must be provided. However, realizing the multiple VCO is costly and difficult.

A wide tuning bandwidth may have a difference between 10% and 15% in a frequency tuning range of the VCO due to a variation in an operation frequency. To solve this problem, a synthesizer using a single VCO operating a multiple band of a concerned spectrum and preventing a variation in a manufacturing process was disclosed in Korean Patent Application No. 2001-0053259. According to the suggested invention, the single VCO of a PLL is digitally controlled so as to tune another range of a frequency.

When an operation frequency of a synthesizer is changed, a reference voltage source is connected to a control input of a VCO to set a frequency of the VCO at an end of a tuning range of the synthesizer. An operation frequency band of the VCO is selectively switched with monitoring the control input of the VCO. When a comparator circuit determines that a tuning voltage of the control input of the VCO is reduced to be less than a reference value, the switching of the operation frequency band of the VCO is controlled, and the VCO obtains a phase locked state in a PLL. According to the prior art, an input power of a VCO is automatically calibrated. However, the input power must be detected from a full band of a frequency whenever an output frequency is changed such that a time delay results.

SUMMARY OF THE INVENTION to the present invention provides a method and a system for calibrating an input voltage of a VCO by which a time delayed for changing a frequency can be reduced and a digital interface used for calibrating the input voltage.

According to an aspect of the present invention, there is provided a method for calibrating an input voltage of a voltage controlled oscillator comprising a capacitor bank so as to output a frequency of the input voltage varying with a variation in a total capacitance value of the capacitor bank, including: setting a lock detection time for tuning a signal phase; setting a lock detection voltage section; setting output frequency values at predetermine spacings; checking connection states of capacitors of the capacitor bank necessary for a lock of the output frequency values; storing information as to the connection states of the capacitors in the output frequency values; and if one of the output frequency values is determined depending on a change of a channel, setting connection states of the capacitors according to the information as to the connection state corresponding to the one frequency value.

The capacitor bank may include: a predetermined number of capacitors having different capacitances and connected to one another in parallel; and switches connected to the capacitors in series. Here, the total capacitance may vary depending on connection states of the switches. The output frequency values at the predetermined spacings may be computed as in Equation below:

$$F_{out} = M + S*n$$

wherein $F_{out}$ denotes an output frequency, M denotes a minimum output frequency, and n is an integer defined as "0," "1," "2" "3," "4," ..., or "N−1."

The lock detection voltage section may be determined by calibrating low and high threshold values of the input voltage. The information as to the connection states of the capacitors respectively corresponding to the output frequency values may be stored in order from the smallest one of the output frequency values. The predetermined spacings may be each 10 MHz. The low threshold value may be 0 V, and the high threshold value may be 1.8 V.

If separation states of the switches connected to the capacitors are "0," connection states of the switches are "1," and a number of the capacitors is N, the information as to the connection states may be stored as binary N-bit symbols. The number of the capacitors may be "4." The connection states of the capacitors may be checked using a relationship between the input voltage and the output frequency determined by a value of the total capacitance depending on combinations of the switches.

If the connection states are not checked for the lock detection time, the connections state of the capacitor corresponding to a next large value of the total capacitance may be checked. If the value of the total capacitance is the smallest and the input voltage value corresponding to the output frequency value is smaller than the low threshold value, the information as to the connection states of the capacitors may be stored and an error message may be output.

If the value of the total capacitance is the largest and the input voltage value corresponding to the output frequency is larger than the high threshold value, the information as to the connection states of the capacitors may be stored and an error message may be output.

According to another aspect of the present invention, there is provided a digital interface for calibrating an input voltage of a voltage controlled oscillator including a capacitor bank so as to output a frequency of the input voltage depending on a variation in a total capacitance value of the capacitor bank, including: a storage; and a signal processor detecting connection states of capacitors of the capacitor bank so as to generate the input voltage generating a lock of an output frequency value at a predetermined spacing based on a lock detection signal indicating whether a lock having a tuned signal phase has occurred and the input voltage value converted into digital symbols, storing information as to the connection states of the capacitors with respect to the output frequency value at the predetermined spacing in the storage, and if one of the output frequency values is determined depending on a change of a channel, setting connection states of the capacitors depending on the information as to the connection state corresponding to the output frequency value depending on the change of the channel. The signal processor may set a lock detection time to check the connection states of the capacitors. The signal processor may set a lock detection voltage section to check the connection states of the capacitors. The signal processor may check the connection states of the capacitors at the output frequency values in order from the smallest one of the output frequency values.

The capacitor bank may include: a predetermined number of capacitors having different capacitances and connected to one another in parallel; and switches connected to the capacitors in series. The lock detection voltage section may be determined by calibrating low and high threshold values of the input voltage value of the voltage controlled oscillator. The connection states of the capacitors may be checked in order from the smallest one of the total capacitance values of the capacitors depending on combinations of the switches.

If one of the output frequency values is determined depending on a change of a channel, the signal processor may generate an instruction to set connection states of the capacitors according to the information as to the connection state corresponding to the output frequency depending on the change of the channel. The low threshold value may be 0 V. The high threshold value may be 1.8V. If separation states of the switches connected to the capacitors are "0," connection states of the switches are "1" and a number of the capacitors is N, the information as to the connection states of the capacitors may be stored as binary N-bit symbols. The number of the capacitors may be four.

According to still another aspect of the present invention, there is provided a system for calibrating an input voltage of a voltage controlled oscillator, including: a lock detector detecting whether a lock having a tuned signal phase has been generated by a phase detector generating an output voltage using a phase difference between an input signal and a reference signal; an analog-to-digital converter converting the input voltage value of the voltage controlled oscillator outputting an oscillator frequency using a voltage applied from an external source into digital symbols; and a digital interface. Here, if the lock detector detects the lock, the lock detector may transmit a lock detection signal to the digital interface, the analog-to-digital converter may transmit the digital symbols to the digital interface, and the digital interface may store information as to connection states of capacitors of a capacitor bank of the voltage controlled oscillator generating an input voltage of the voltage controlled oscillator generating a lock at the output frequency value at a predetermined spacing.

The system may further include: the voltage controlled oscillator. Here, if a desired output frequency value is determined, the voltage controlled oscillator may receive the information as to the connection state of the capacitor of the capacitor bank corresponding to the output frequency value and output the output frequency value according to the information as to the connection state. The output frequency may be output according to the information as to the connection state to set a connection state of the capacitor bank of the voltage controlled oscillator depending on the information as to the connection state.

The capacitor bank may include: a predetermined number of capacitors having different capacitances and connected to one another in parallel; and switches connected to the capacitors in series. A number of the capacitors may be four.

BRIEF DESCRIPTION OF THE DRAWINGS

The above and/or other aspects of the present invention will be more apparent by describing certain exemplary embodiments of the present invention with reference to the accompanying drawings, in which.

DETAILED DESCRIPTION OF THE EXEMPLARY EMBODIMENTS

Certain exemplary embodiments of the present invention will be described in greater detail with reference to the accompanying drawings.

In the following description, same drawing reference numerals are used for the same elements even in different drawings. The matters defined in the description such as a detailed construction and elements are nothing but the ones provided to assist in a comprehensive understanding of the invention. Thus, it is apparent that the present invention can be carried out without those defined matters. Also, well-known functions or constructions are not described in detail since they would obscure the invention in unnecessary detail.

Figure 1:
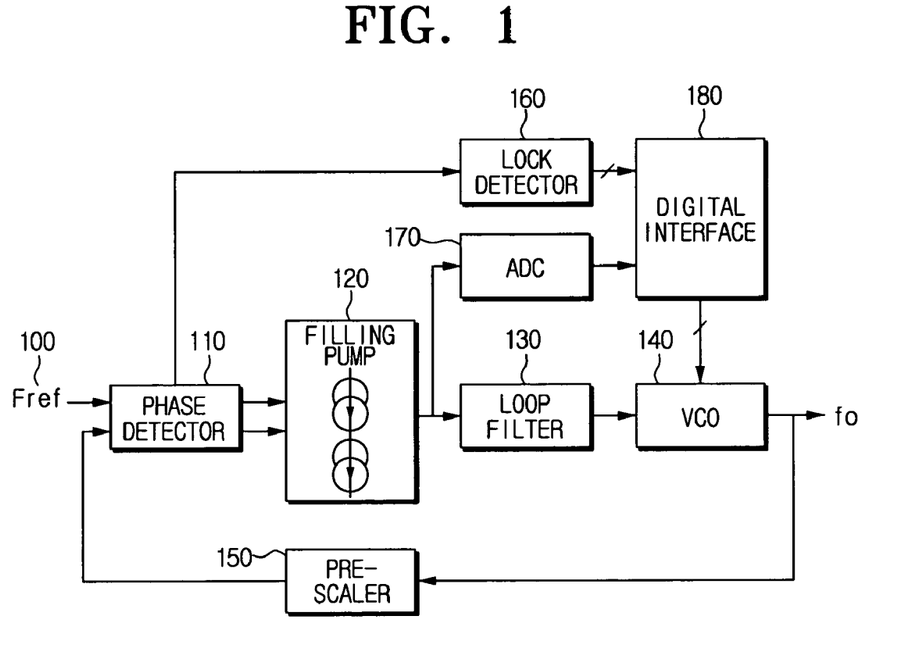
FIG. 1 is a block diagram of a frequency synthesizer including a system for calibrating an input voltage of a VCO according to an exemplary embodiment of the present invention.

FIG. 1 is a block diagram of a frequency synthesizer including a system for calibrating an input voltage of a VCO according to an exemplary embodiment of the present invention. Referring to FIG. 1, the frequency synthesizer includes a phase detector 110, a filling pump 120, a loop filter 130, a VCO 140, a pre-scaler 150, a lock detector 160, an analog-to-digital converter (ADC) 170, and a digital interface 180.

Here, a reference frequency 100 is a reference with respect to a frequency deviation, fixed to an allocated frequency, and in a specific band. A shift of a characteristic frequency of the reference frequency 100 has the same absolute value and sign as a shift existing in the center of a frequency band in which the characteristic frequency is emitted and occupied. The phase detector 110 is a demodulator demodulating a phase modulation wave and generates an output voltage having amplitude and polarity varying due to a phase difference between an input signal and a reference signal. The filling pump 120 receives the output voltage from the phase detector 110 to reverse a direction of a current and is connected to a rear portion of the phase detector 110 in a PLL to convert the phase difference into a voltage. The loop filter 130 is a low pass filter, removes a high frequency component generated in the phase detector 110, and determines tuning and response characteristics of the PLL.

The VCO 140 outputs a desired oscillator frequency using a voltage applied from an external source. In other words, if the VCO 140 receives a voltage from the loop filter 130, the VCO 140 outputs a frequency using the voltage. The prescaler 150 calibrates a speed of an input clock supplied to a timer. The ADC 170 converts a continuous analog signal into a coded digital signal. The ADC 170 digitalizes a voltage signal continuously measured by the filling pump 120 and transmits the digital voltage signal in a format of four-bit symbols to the digital interface 180. The lock detector 160 detects whether a lock is generated by the phase detector 110. If the lock detector 160 detects that the lock is generated by the phase detector 110, the lock detector 160 transmits a lock detection signal to the digital interface 180.

An operation principle of a frequency synthesizer including a system for calibrating an input voltage of a VCO according to the present invention will now be described with reference to FIG. 1. The digital interface 180 checks connection states of capacitors of a capacitor bank of the VCO 140 necessary for a locks of an output frequency value at a predetermined spacing from the voltage signal transmitted from the ADC 170 and the lock detection signal transmitted from the lock detector 160 and then stores information regarding the connection state of the capacitors at each of the output frequency values in order from the smallest one of the output frequency values.

If an output frequency depending on a change of a channel is determined, the digital interface 180 checks an input voltage value of the VCO 140 corresponding to the output frequency depending on the change of the channel through the information regarding the connection state of the output frequency value depending on the change of the channel. The digital interface 180 calibrates the input voltage of the VCO 140 using the input voltage value of the VCO 140 corresponding to the output frequency depending on the change of the channel.

Figure 2:
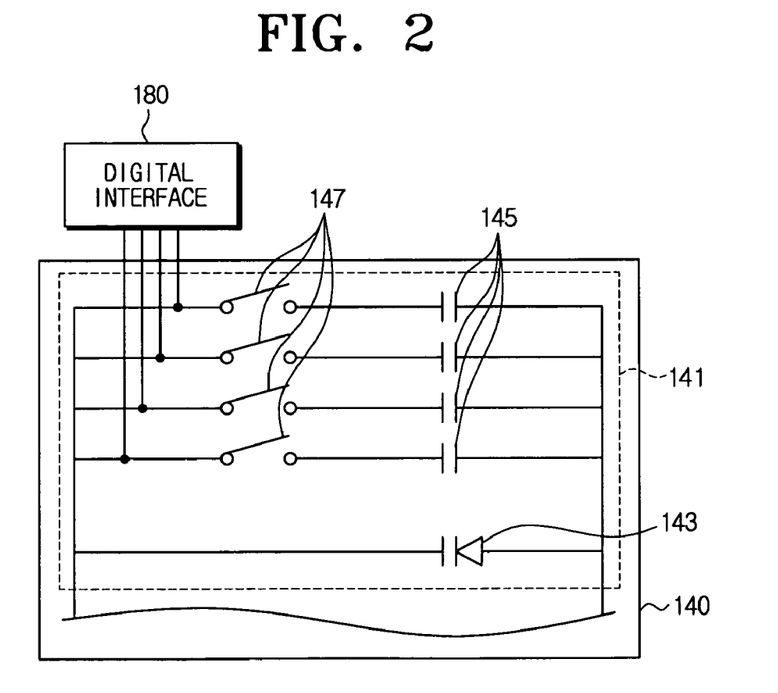
FIG. 2 is a schematic view illustrating a structure of a capacitor bank of a VCO according to an exemplary embodiment of the present invention.

FIG. 2 is a schematic view illustrating a structure of a capacitor bank of a VCO according to an exemplary embodiment of the present invention. Referring to FIG. 2, a capacitor bank 141 of the VCO 140 includes a plurality of capacitors 145 connected to one another in parallel and a plurality of switches 147 respectively connected to the capacitors 145 in series. The capacitor bank 141 includes a varactor 143 connected to the capacitors 145 in parallel. The digital interface 180 controls the switches 147 connected to the capacitors 145 in series to be opened and closed so as to calibrate a total capacitance value of the capacitor bank 141. The output frequency depending on the input voltage of the VCO 140 varies with a variation in the total capacitance value of the capacitor bank 141.

Figure 3:
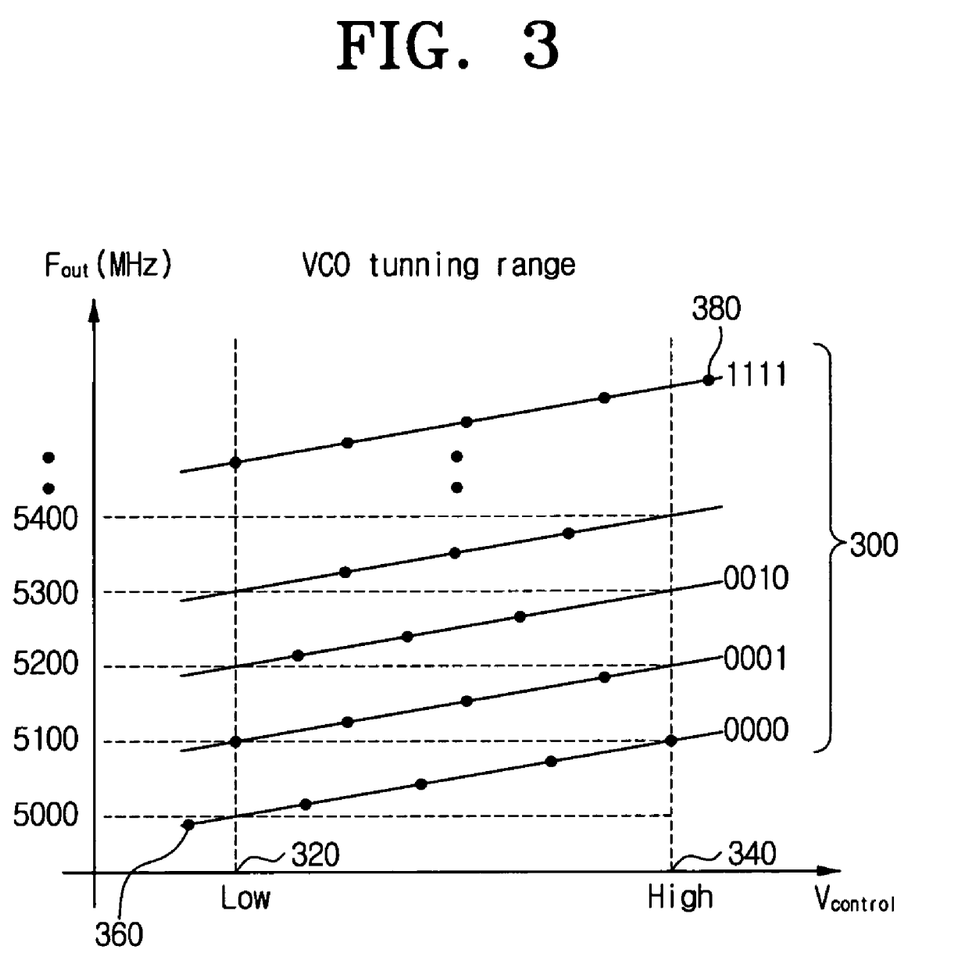
FIG. 3 is a graph illustrating variations in an input voltage and an output frequency of a VCO with respect to a total capacitance value of a capacitor bank of the VCO according to an exemplary embodiment of the present invention.

FIG. 3 is a graph illustrating variations in an input voltage and an output frequency of a VCO with respect to a total capacitance value of a capacitor bank of the VCO according to an exemplary embodiment of the present invention. Here, the horizontal axis denotes the input voltage of the VCO 140, and the vertical axis denotes the output frequency of the VCO 140. Four-bit symbols 300 shown on the right side of the graph of FIG. 3 respectively denote opening and closing states of the switches 147 connected to the capacitors 145 of the capacitor bank 141 in series. The total capacitance value of the capacitor bank 141 varies with the opening and closing states of the switches 147, and thus a position of the graph shifts. A low threshold value 320 and a high threshold value 340 are shown on the horizontal axis of the graph. A lock is detected within a section determined by the low and high threshold values 320 and 340.

Figure 4:
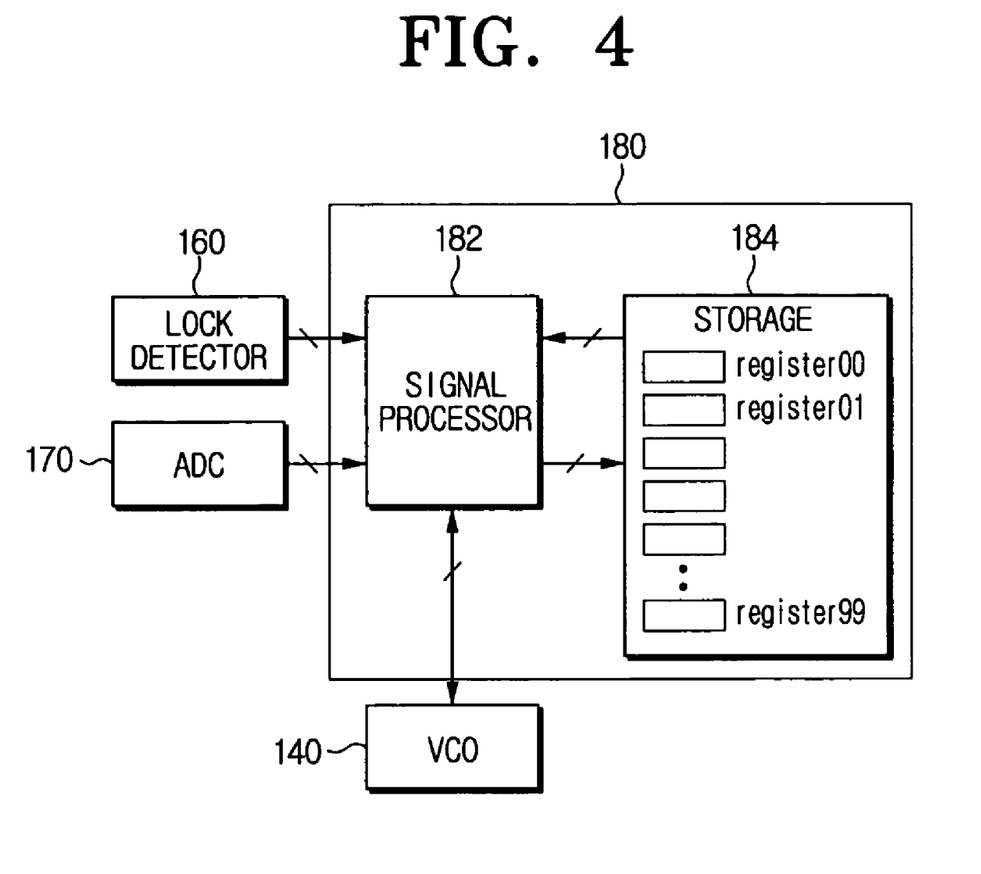
FIG. 4 is a block diagram illustrating an operation principle of a digital interface of a system for calibrating an input voltage of a VCO according to an exemplary embodiment of the present invention.

FIG. 4 is a block diagram illustrating an operation principle of a digital interface of a system for calibrating an input voltage of a VCO according to an exemplary embodiment of the present invention. As shown in FIG. 4, the digital interface 180 includes a signal processor 182 and a storage 184. The signal processor 182 receives the lock detection signal for detecting whether the lock has been generated by the lock detector 160 and the input voltage value of the VCO 140 converted into the digital symbols from the ADC 170. The signal processor 182 checks the connection states of the capacitors 145 of the capacitor bank 141 inducing the input voltage generating the lock of the output frequency value at the predetermined spacing. Thereafter, the signal processor 182 transmits the information regarding the connection states to the storage 184. The storage 184 stores the information regarding the connection states of the capacitors 145 at the output frequency at the predetermined spacing. If the channel is changed and thus the output frequency is determined, the signal processor 182 reads the information regarding the connection state of the capacitor corresponding to the output frequency value from the storage 184. The signal processor 182 sets connection states of the capacitors 145 of the capacitor bank 141 of the VCO 140 according to the information regarding the connection states. As a result, a signal phase of the output frequency determined with the change of the channel is tuned.

Figure 5:
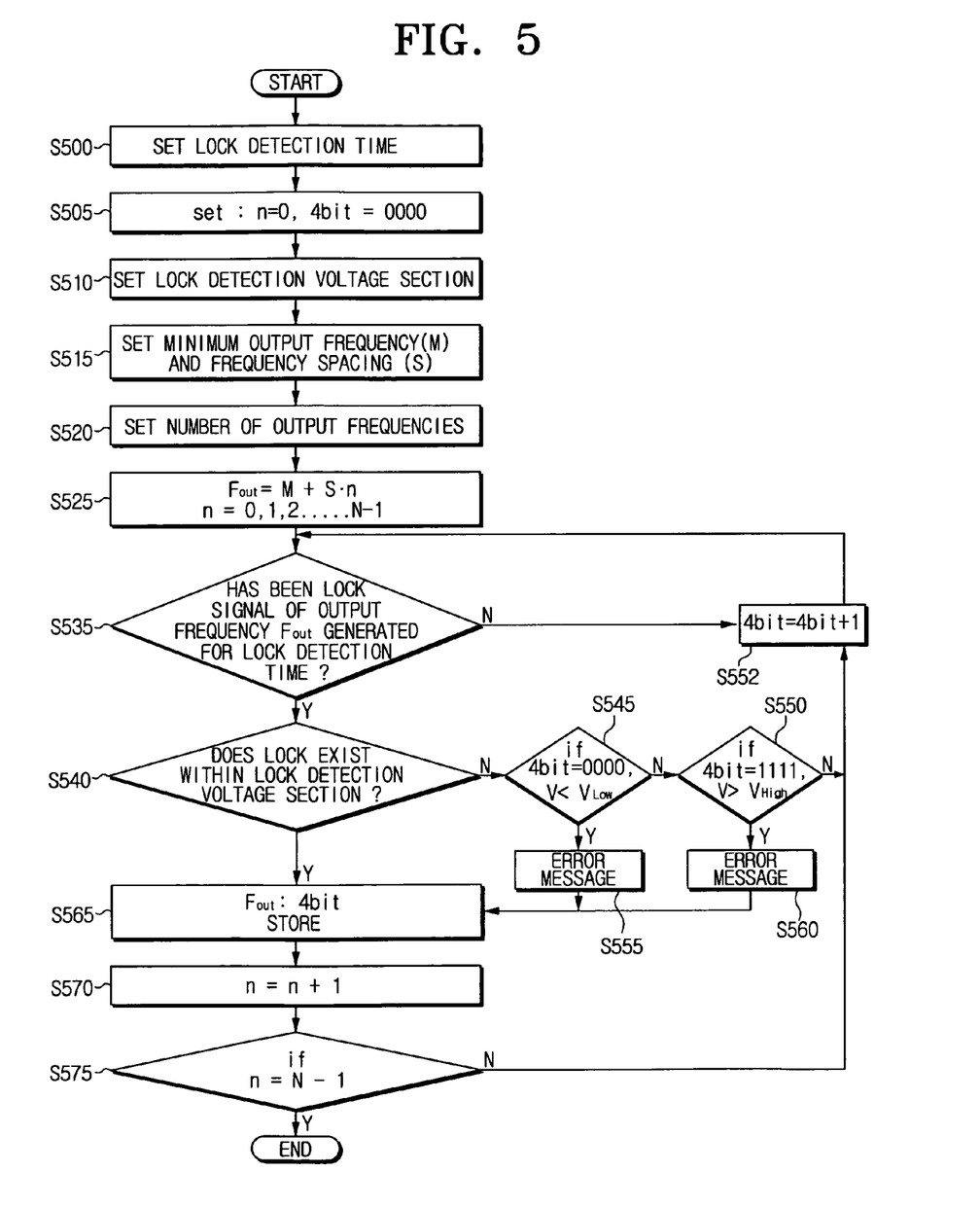
FIG. 5 is a flowchart of a method for calibrating an input voltage of a VCO according to an exemplary embodiment of the present invention.

FIG. 5 is a flowchart of a method for calibrating an input voltage of a VCO according to an exemplary embodiment of the present invention. A principle of the method of calibrating the input voltage of the VCO will be described with reference to FIG. 5. If a power is applied to the system, the digital interface 180 sets a lock detection time in operation S500. In operation S505, a parameter n determining an output frequency is set to "0," and binary four-bit symbols indicating connection states of the switches 147 connected to the capacitors 145 of the capacitor bank 141 are set to "0000." Here, four-bit symbols indicate that four capacitors are connected to one another in parallel. If a number of the capacitors 145 of the capacitor bank 141 is N, the information regarding the connection states of the switches 147 may be binary N-bit symbols.

Here, "0" denotes a separation state of a switch connected to a corresponding capacitor in series, and "1" denotes a connection state of the switch. If the binary four-bit symbols are taken as an example, "1" is continuously added to "0000" to increase "0000" to "0001," "0010," "0011," "0100," "0101," "0110," "0111," "1000," "1001," "1010," "1011," "1100," "1101," "1110," and "1111" in order. These binary four-bit symbols indicate possible combinations with respect to connections and couplings of capacitors in corresponding positions, and the total capacitance of the capacitors 145 connected to one another in parallel is sequentially increased. As a result, the graph illustrating the variations in the output frequency of the input voltage of the VCO 140 with respect to the total capacitance determined by the information regarding the connection states shifts upward as shown in FIG. 3. Shift distances among the graphs shown in FIG. 3 can be calibrated by changing capacitances of the capacitors 145.

In operation S510, the low and high threshold values 320 and 340 of the input voltage of the VCO 140 are set to set a lock detection voltage section. Here, the low and high threshold values 320 and 340 may be calibrated, and thus the lock detection voltage section suitable in a communication environment may be set. The low threshold value 320 may be 0 V, and the high threshold value 340 may be 1.8 V. In operation S520, a minimum output frequency value M and a frequency spacing S that will be sequentially set is set. In operation S525, a relation equation of an output frequency can be obtained as in Equation 1:

$$F_{out}=M+S*n \qquad (1)$$

wherein $F_{out}$ denotes the output frequency, M denotes the minimum output frequency, and n denotes an integer, i.e., a value defined as "0," "1," "2," "3," "4," ..., or "N−1." In operation 535, the digital interface 180 detects a lock for the lock detection time set when the output frequency is the minimum output frequency value M and the information regarding the connection states of the capacitors 145 is "0000" to check whether a lock detection signal has been generated. If the digital interface 180 checks in operation 535 that the lock detection signal has not been generated, the digital interface 180 adds "1" to the binary four-bit symbols in operation S552. In operation S535, the digital interface 180 checks whether the lock detection signal has been generated on the graph of FIG. 3 determined by the connection state of the capacitor corresponding to the information regarding the connection state corresponding to "0001." If the digital interface 180 checks that the lock detection signal has been generated from the corresponding output frequency value for the lock detection time, the digital interface 180 checks whether the input voltage value exists within the lock detection voltage section in operation S540.

If the input voltage value does not exist within the lock detection voltage section, the information regarding the connection state is "0000," and the input voltage value is smaller than the low threshold value 320 in operation S545, the lock occurs at a point 360 at which the input voltage value is less than the low threshold value 320 on the lowermost graph of the graphs of FIG. 3. In operation S555, an error message is output. In operation S565, the information regarding the connection state "0000" is stored in the corresponding output frequency value.

If the input voltage value does not exist within the lock detection voltage section, the information regarding the connection state is "1111," and the input voltage value is larger than the high threshold value 340 in operation S550, the lock occurs at a point S380 at which the input voltage value is more than or equal to the high threshold value 340 on the uppermost graph of the graphs of FIG. 3. In operation S560, an error message is output. In operation S565, the information regarding the connection state "1111" is stored in the corresponding output frequency value.

If the input voltage value does not exit within the lock detection voltage section, the information regarding the connections state is "0000," and the input voltage value is not smaller than the low threshold value 320 in operation S545, and the information regarding the connection state is "1111" and the input voltage value is not larger than the high threshold value 340 in operation S550, "1" is added to the binary four-bit symbols in operation S552. In operation S535, the digital interface 180 checks whether the lock detection signal has been generated on the graph of FIG. 3 determined by the connection state of the capacitor corresponding to the information regarding the connection state.

If the input voltage value does not exist within the lock detection voltage section, in operation S565, the corresponding information regarding the connection state is stored in the corresponding output frequency value. In operation S570, "1" is added to the parameter n. In operation S575, it is checked whether a value by adding "1" to the parameter n corresponds to "N−1." If the value does not correspond to "N−1," in operation S525, an output frequency at a next operation is set using a newly determined parameter n. Operations S525 through 575 are repeated to store the information regarding the connection state of the capacitor bank 141 with respect to the output frequency in the storage 184 of the digital interface 180. In operation S575, it is checked whether the parameter n corresponds to "N−1." If the parameter n corresponds to "N−1," the operation of storing the information regarding the connection state of the capacitor bank 141 with respect to the output frequency is ended.

If the channel is changed and thus the output frequency is determined, the signal processor 182 shown in FIG. 4 reads the information regarding the connection state of the capacitor corresponding to the determined output frequency value. The signal processor 182 sets connection states of the capacitors 145 of the capacitor bank 141 of the VCO 140 according to the information regarding the connection state. As a result, the VCO 140 can speedily tune the signal phase of the output frequency value.

As described above, in a method and a system for calibrating an input voltage of a VCO and a digital interface used for calibrating the input voltage according to the present invention, a time delayed for calibrating the input voltage of the VCO can be reduced. Thus, a central frequency can be fast tuned with a speedy variation of a transmitted frequency. Also, a variation in an output frequency of the VCO due to a deviation in a manufacturing process can be coped with. In addition, a stable frequency operation can be performed in a multiple frequency band.

The foregoing embodiments and advantages are merely exemplary and are not to be construed as limiting the present invention. The present teaching can be readily applied to other types of apparatuses. Also, the description of the exemplary embodiments of the present invention is intended to be illustrative, and not to limit the scope of the claims, and many alternatives, modifications, and variations will be apparent to those skilled in the art.

What is claimed is:

1. A method for calibrating an input voltage of a voltage controlled oscillator comprising a capacitor bank comprising a plurality of capacitors so as to output a frequency of the input voltage varying with a variation in a total capacitance value of the capacitor bank, the method comprising:
   setting a lock detection time for tuning a signal phase;
   setting a lock detection voltage section;
   setting output frequency values at predetermine spacings;
   checking connection states of capacitors of the capacitor bank necessary for a lock of the output frequency values;
   storing information regarding the connection states of the capacitors in the output frequency values; and
   if one of the output frequency values is determined depending on a change of a channel, setting connection states of the capacitors according to the information regarding the connection state corresponding to the determined frequency value.

2. The method of claim 1, wherein the capacitors have different capacitances and are connected to one another in parallel, the capacitor bank comprises a plurality of switches which are connected to the capacitors in series, and the total capacitance value of the capacitor bank varies depending on connection states of the switches.

3. The method of claim 1, wherein the output frequency values at the predetermined spacings are computed as in Equation below:

$$F_{out}=M+S*n$$

wherein $F_{out}$ denotes an output frequency, M denotes a minimum output frequency, and n is an integer defined as "0," "1," "2," "3," "4," ..., or "N−1."

4. The method of claim 1, wherein the lock detection voltage section is determined by calibrating low and high threshold values of the input voltage.

5. The method of claim 1, wherein the information regarding the connection states of the capacitors respectively corresponding to the output frequency values is stored in order from a smallest one of the output frequency values.

6. The method of claim 1, wherein the predetermined spacings are each 10 MHz.

7. The method of claim 4, wherein the low threshold value is 0 V, and the high threshold value is 1.8 V.

8. The method of claim 1, wherein if separation states of the switches connected to the capacitors are "0," connection states of the switches are "1," and a number of the capacitors is N, the information regarding the connection states is stored as binary N-bit symbols.

9. The method of claim 2, wherein a number of the capacitors is four.

10. The method of claim 2, wherein the connection states of the capacitors are checked using a relationship between the input voltage and the output frequency determined by the total capacitance value depending on combinations of the switches.

11. The method of claim 10, wherein if the connection states are not checked for the lock detection time, the connections state of the capacitor corresponding to a next large value of the total capacitance value is checked.

12. The method of claim 10, wherein if the total capacitance value is smallest and the input voltage value corresponding to the output frequency value is smaller than the low threshold value, the information regarding the connection states of the capacitors is stored and an error message is output.

13. The method of claim 10, wherein if the total capacitance value is largest and the input voltage value corresponding to the output frequency is larger than the high threshold value, the information regarding the connection states of the capacitors is stored and an error message is output.

14. A digital interface for calibrating an input voltage of a voltage controlled oscillator comprising a capacitor bank comprising a plurality of capacitors so as to output a frequency of the input voltage depending on a variation in a total capacitance value of the capacitor bank, the digital interface comprising:
 a storage; and
 a signal processor which detects connection states of capacitors of the capacitor bank so as to generate the input voltage generating a lock of an output frequency value at a predetermined spacing based on a lock detection signal indicating whether a lock having a tuned signal phase has occurred and the input voltage value converted into digital symbols, stores information regarding the connection states of the capacitors with respect to the output frequency value at the predetermined spacing in the storage, and if one of output frequency values is determined depending on a change of a channel, sets connection states of the capacitors depending on the information regarding the connection state corresponding to the determined output frequency value depending on the change of the channel.

15. The digital interface of claim 14, wherein the signal processor sets a lock detection time to check the connection states of the capacitors.

16. The digital interface of claim 14, wherein the signal processor sets a lock detection voltage section to check the connection states of the capacitors.

17. The digital interface of claim 14, wherein the signal processor checks the connection states of the capacitors at the output frequency values in order from a smallest one of the output frequency values.

18. The digital interface of claim 14, wherein the capacitors have different capacitances and are connected to one another in parallel, and the capacitor bank further comprises switches connected to the capacitors in series.

19. The digital interface of claim 16, wherein the lock detection voltage section is determined by calibrating low and high threshold values of the input voltage value of the voltage controlled oscillator.

20. The digital interface of claim 18, wherein the connection states of the capacitors are checked in order from a smallest one of the total capacitance values of the capacitors depending on combinations of the switches.

21. The digital interface of claim 14, wherein if one of the output frequency values is determined depending on a change of a channel, the signal processor generates an instruction to set connection states of the capacitors according to the information regarding the connection state corresponding to the output frequency depending on the change of the channel.

22. The digital interface of claim 19, wherein the low threshold value is 0 V.

23. The digital interface of claim 19, wherein the high threshold value is 1.8 V.

24. The digital interface of claim 14, wherein if separation states of the switches connected to the capacitors are "0," connection states of the switches are "1," and a number of the capacitors is N, the information regarding the connection states of the capacitors is stored as binary N-bit symbols.

25. The digital interface of claim 14, wherein the number of the capacitors is four.

26. A system for calibrating an input voltage of a voltage controlled oscillator, the system comprising:
 a lock detector which detects whether a lock having a tuned signal phase has been generated by a phase detector generating an output voltage using a phase difference between an input signal and a reference signal;
 an analog-to-digital converter which converts the input voltage value of the voltage controlled oscillator outputting an oscillator frequency using a voltage applied from an external source into digital symbols; and
 a digital interface,
 wherein if the lock detector detects the lock, the lock detector transmits a lock detection signal to the digital interface, the analog-to-digital converter transmits the digital symbols to the digital interface, and the digital interface stores information regarding connection states of capacitors of a capacitor bank of the voltage controlled oscillator generating an input voltage of the voltage controlled oscillator generating a lock at the output frequency value at a predetermined spacing.

27. The system of claim 26, wherein if a desired output frequency value is determined, the voltage controlled oscillator receives the information regarding the connection state of a capacitor of the capacitor bank corresponding to the output frequency value and outputs the output frequency value according to the information regarding the connection state.

28. The system of claim 27, wherein the output frequency is output according to the information regarding the connection state to set a connection state of the capacitor bank of the voltage controlled oscillator depending on the information regarding the connection state.

29. The system of claim 28, wherein the capacitors have different capacitances and are connected to one another in parallel, and switches of the capacitor bank are connected to the capacitors in series.

30. The system of claim 29, wherein a number of the capacitors is four.

* * * * *